United States Patent [19]

Kaegebein

[11] 4,249,147

[45] Feb. 3, 1981

[54] CAVITY FILTER AND MULTI-COUPLER UTILIZING SAME

[75] Inventor: Daniel P. Kaegebein, Depew, N.Y.

[73] Assignee: TX RX Systems Inc., Angola, N.Y.

[21] Appl. No.: 13,363

[22] Filed: Feb. 21, 1979

Related U.S. Application Data

[63] Continuation of Ser. No. 952,011, Oct. 20, 1978.

[51] Int. Cl.[3] .............................................. H03H 7/09

[52] U.S. Cl. .................................... 333/202; 333/176; 333/230

[58] Field of Search ........................ 333/176, 205–207, 333/209, 211, 223, 224, 227, 231, 202, 230; 343/180

[56] References Cited

U.S. PATENT DOCUMENTS

| | | | |
|---|---|---|---|
| 1,934,602 | 11/1933 | Gilman | 333/125 X |
| 2,484,798 | 10/1949 | Bradley | 333/230 X |
| 2,514,779 | 7/1950 | Martin | 333/135 X |
| 2,637,782 | 5/1953 | Magnuski | 333/208 |
| 2,938,177 | 5/1960 | Vogelman | 333/126 |
| 3,124,768 | 3/1964 | Tilston | 333/126 |
| 3,537,041 | 10/1970 | Kommrusch | 333/202 |
| 3,717,827 | 2/1973 | Kaegebein | 325/23 X |
| 3,815,137 | 6/1974 | Kaegebein | 343/180 |
| 3,876,963 | 4/1975 | Graham | 333/208 X |
| 3,925,739 | 12/1975 | Brownell et al. | 333/176 |
| 4,075,583 | 2/1978 | Kershaw | 334/45 X |
| 4,080,601 | 3/1978 | Alcorn, Jr. | 343/180 |

OTHER PUBLICATIONS

David et al. *Integrated Site System for VHF/UHF Mobile Communications,* Communications International, Feb. 1975, pp. 16–21.

*Primary Examiner*—Eugene R. LaRoche
*Attorney, Agent, or Firm*—Bean, Kauffman & Bean

[57] ABSTRACT

An R.F. resonant cavity filter for connection in a transmission line and multicouplers utilizing same, said filter adapted to pass only signals of a predetermined frequency into and out of a branch transmission line, to block signals of said predetermined frequency from propagating down said transmission line in one direction but not the other, and to pass all other signals substantially undisturbed.

41 Claims, 12 Drawing Figures

CAVITY FILTER AND MULTI-COUPLER UTILIZING SAME

RELATED APPLICATIONS

This is a continuing application of the prior, copending U.S. Application Ser. No. 952,011 filed Oct. 20, 1978, the benefit of the filing date of which is hereby claimed.

TECHNICAL FIELD OF THE INVENTION

The present invention relates to electrical filter networks for filtering selected frequencies. More specifically, the present invention relates to a filter which utilizes, in combination, a high Q cavity filter and a series lumped constant reactive circuit to produce an electrical filter of improved characteristics. The present invention also relates to multicouplers such as diplexers and duplexers which include a novel filter network that incorporates the disclosed filter. Accordingly, the general objects of the present invention are to provide novel and improved apparatus and methods of such character.

BACKGROUND OF THE INVENTION

In my prior U.S. Pat. Nos. 3,717,827 and 3,815,137 issued on Feb. 20, 1973 and June 4, 1974 respectively, as well as in prior U.S. Pat. No. 3,124,768 issued Mar. 10, 1964, interference problems in the field of radio communication are discussed. Briefly these problems involve the simultaneous utilization of one antenna or transmission line with two or more transmitting and receiving pieces of equipment operating at carrier signals of different frequencies such as are found in multicouplers in general and in diplexers and duplexers specifically. My prior co-pending applications Ser. No. 826,412 filed Aug. 22, 1977 and Ser. No. 952,011 filed Oct. 20, 1978 are also concerned with and are directed to the design of filters and multicouplers assembled therefrom.

In order to properly isolate various pieces of equipment from one another, a number of filter networks are commonly utilized as is taught in the multicoupler of U.S. Pat. No. 3,124,768. Each such network includes a first cavity resonator and a quarter wavelength transmission line tuned to pass only the frequency of the signaling device connected to the network, and a second cavity resonator and a second quarter wavelength transmission line tuned to block only the frequency of the signaling device and to pass the frequencies of the other signaling devices. Each of the second cavity resonators and second transmission lines are connected in series and in turn are connected to the common antenna.

While the multicoupler taught in patent 3,124,768 is suitable for many applications, it nevertheless poses difficulties which have not heretofore been easily and inexpensively solved. A first difficulty of the prior art devices is that the arrangement of cavity filters and quarter wavelength transmission lines required to act as transformers, require friction couplings to electrically join the cavity filters, the transmission lines, and other components into a unified system. It is well known that friction couplings create intermodulation interference problems: the greater the number of friction couplings, the greater the intermodulation interference. Additionally, it is well recognized that transmission lines introduce insertion losses which may detrimentally reduce signal strength. Since the prior art device taught in U.S. Pat. No. 3,124,768 requires a multiplicity of quarter wavelength transmission lines and a multiplicity of friction connectors, both intermodulation interference and insertion loss problems are present.

Thus, it is evident that an improved multicoupler with reduced numbers of required transmission lines and friction couplings is needed to reduce to a minimum the intermodulation interference loss problems of the prior art devices. Obviously, a multicoupler having smaller numbers of these components will also have the advantage of being significantly less expensive.

Typical prior known multicouplers utilize standard cavity bandpass and notch filters as the resonating components in their networks. A standard notch cavity filter includes an electrically resonant cavity with a moveable co-axial electrically conducting center probe for tuning the resonant frequency and a coupling loop connected at one end to the transmission line and grounded at its opposite end on the interior of the cavity. In a multicoupler, the standard notch filter acts as a short circuit in the transmission line spaced off a quarter wave from the junction at which the high impedance is desired. Varying the position, length, profile, etc., of the coupling loop permits the inductive coupling between the cavity and the transmission line to be increased or decreased. Such variation of the inductive coupling increases or decreases the loading of the cavity and hence increases or decreases the attenuation produced by the notch of the filter.

While such adjustability is desirable, standard prior art notch cavity filters have the deficiency that variation of the notch depth by adjustment of the grounded electrical loop causes the resonant frequency of the cavity to shift. When the notch of the notch filter shifts in this manner, it detrimentally effects the performance of the multicoupler. Accordingly, if one wishes to vary the attenuation of the reject band of the notch filter of prior art multicouplers, not only would the inductive coupling between the grounded coupling loop and the cavity have to be adjusted, but also the resonant frequency of the cavity itself would have to be adjusted so as to shift it back to the frequency of the respective signaling device.

Accordingly, in many prior art applications in which notch filters have been used, adjustment of the filters to increase or decrease frequency isolation has involved a complicated readjustment of not only the inductive coupling with the cavity but also of the cavity resonant frequency. Conversely, adjustment of a typical prior art notch filter to tune it to a different frequency has required a dual adjustment of tuning the resonant frequency of the cavity and then varying the inductive coupling of the grounded loop of the cavity so as to compensate for the effect produced on the depth of the notch by the change in resonant frequency of the cavity.

It is evident therefore that a filter having notch depth tuning characteristics and frequency tuning characteristics independent of one another is desirable and would be especially useful in the context of a multicoupler. With such a filter, the multicoupler could be adjusted and tuned in a variety of ways without involving a complicated interdependent fine tuning operation. It is also desirable that such a filter, when properly connected with other components in a multicoupler, perform the functions of both a notch filter and a bandpass filter at different frequencies so that the number of cavity filters required for proper operation of the multicoupler may be reduced to a minimum.

THE INVENTION

The inventive bandpass filter of the present application and multicouplers utilizing same avoids the defects and deficiencies of the prior art filters and multicouplers while also reducing the cost thereof. It does so by utilizing a novel approach which permits the filter to uniquely and simultaneously perform the functions of a notch filter, a bandpass filter and a transmission line for signals of different frequencies.

Furthermore, the present bandpass filter enables the construction of a multicoupler which minimizes the total number of filters, friction and interconnecting transmission lines required. Accordingly, a multicoupler which includes the filter of the present invention is not only significantly less expensive than heretofore available, but is also less plagued with the intermodulation interference and insertion loss problems of prior art multicouplers. Finally, the multicouplers assembled in accordance with the invention have the added advantage of being readily expandable or contractable without the requirement of a complicated adjustment of transmission cable lengths.

The subject filter is adapted to be inserted directly into a transmission line and comprises a series lumped constant reactive circuit including a series connected inductive loop inductively coupled into a cavity resonator tuned to resonate at a predetermined frequency: the frequency of the pass band of the filter. The filter also includes a grounded coupling loop to permit the device to simultaneously function as a T-junction and a bandpass filter. When connected in a transmission line in a first multicoupler embodiment, an R.F. short is created in the line for signals having a frequency equal to the resonant frequency of the cavity. Signals at that frequency are then blocked from propagating further down the line. In this manner, the device then acts as a bandpass filter and shunts energy at the resonant frequency away from the through line and down a side channel. At frequencies different from the resonant frequency of the cavity, the device has low impedance in the through transmission line so as to produce broad lateral pass bands on either side of the selected resonant frequency.

The series lumped constant reactive circuit of the filter may include a capacitance connected in series with the inductive loop. In order to obtain a symmetrical characteristic curve with broad pass bands on either side of the resonant frequency of the cavity, the series lumped constant reactive circuit may be adjustable so that the capacitive reactance of the series lumped constant circuit equals the inductive reactance of the loop. Alternatively, the series lumped constant reactive circuit may be adjustable so that the capacitive reactance and the inductive reactance are not equal thereby producing an asymmetrical curve with increased roll-off on one side and decreased roll-off on the other.

In a preferred arrangement, the capacitance and the inductive loop of the lumped constant reactive circuit are disposed within a high Q quarter wave resonant cavity having a movable electrically conductive center probe. The reactive circuit and particularly the series connected inductive loop are mounted to permit variation of the magnitude of the inductive coupling between the inductive loop and the cavity resonator. In the preferred form, the inductive loop is rotatably mounted within the cavity so that the inductive loop may be rotated to cause a variation of the amount of cavity magnetic field linked by the loop. An alternative form, with the capacitor mounted exterior to the cavity, is also possible although usually less desirable. Furthermore, it may be desirable to provide a variable capacitor so that the balance between the capacitive reactance and the inductive reactance may be readjusted to obtain a rejection curve of a particular asymmetrical shape.

The filter of the present invention may be utilized to assemble a plurality of different multicoupler embodiments which are readily modified to contain additional or fewer transmitter and/or receiver signaling devices. When so used, the filter performs a bandpass function by means of a coupling loop grounded at one end on the interior of the cavity and connected to a branch transmission line at its other end. The multicoupler is then assembled by interrupting a transmission line at spaced positions and inserting therein the modified filter and each of the different signaling devices are connected to its respective cavity via the coupling loop associated with the respective cavity filter.

In one embodiment, means, such as an open circuit stub at an electrical length equal to an odd multiple of a quarter wavelength of the average frequency of the band of frequencies handled by the multicoupler, may be provided for producing a short circuit notch condition at the location of each filter for the frequency equal to the resonant frequency of the particular filter. In another embodiment, a short circuit stub at an electrical length equal to a multiple of a half wavelength is used and in a third embodiment the end of the transmission line is terminated in an impedance equal to the impedance of the transmission line to produce a power split with each of the branch circuits at their respective frequencies.

BRIEF DESCRIPTION OF THE DRAWINGS

The present invention may be better understood and its numerous objects and advantages will become apparent to those skilled in the art by reference to the accompanying drawings wherein like reference numerals refer to like elements in the several figures and in which.

DESCRIPTION OF THE BEST MODE OF THE INVENTION

Figure 1:
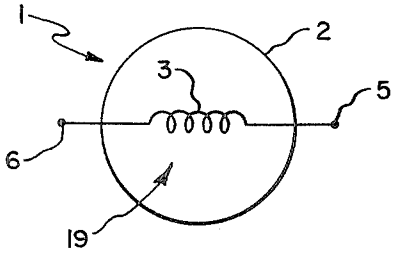
FIGS. 1, 2 and 3 are schematic representations of different embodiments of an inventive notch filter.

While the invention is susceptible of various modifications and alternative constructions, there is shown in the drawings and there will hereinafter be described, in detail, a description of the preferred or best known mode of the invention. It is to be understood, however, that the specific description and drawings are not intended to limit the invention to the specific form disclosed. On the contrary, it is intended that the scope of this patent include all modifications and alternative constructions thereof falling within the spirit and scope of the invention as expressed in the appended claims to the full range of their equivalents.

Having specific reference to the drawings wherein like parts are designated by the same reference numerals throughout the several views, the notch filter 1 and bandpass filter 10 are schematically illustrated in FIGS. 1, 2 and 3 and FIGS. 4, 5 respectively as comprising a resonant cavity 2 containing therein a series lumped constant reactive circuit 19 which includes at least an inductive loop 3.

In the filter embodiments shown in FIGS. 2, 3, 4 and 5 the series lumped constant reactive circuit 19 also includes a series connected capacitor 4. In all cases, circuit 19 is associated with the resonant cavity 2 in such a manner that inductive loop 3 is inductively coupled with the cavity but is electrically insulated from the walls of the cavity at the circuit's points of entry and exit rather than being electrically connected to the cavity. While other arrangements may be possible, the preferred means of inductively coupling inductive loop 3 with the cavity is to physically locate loop 3 on the interior of the cavity as schematically illustrated in the figures. Opposite end terminals 5 and 6 of circuit 19 are shown and may comprise co-axial connectors which permit the notch filter 1 or the bandpass filter 10 to be inserted into a co-axial transmission line.

Figure 3:
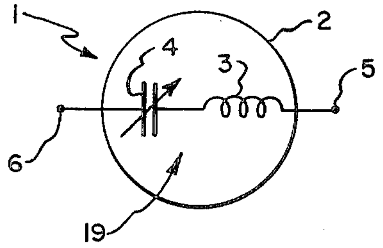
Figure 4:
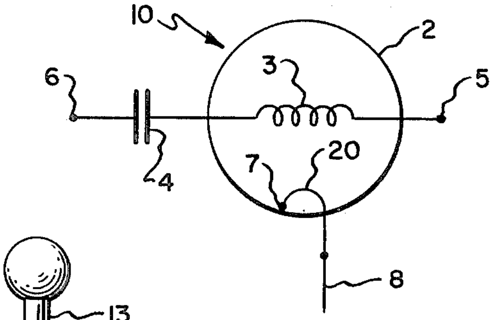
FIGS. 4 and 11 are schematic representations of the filter of the present invention modified to perform a bandpass function rather than a notch function.
Figure 5:
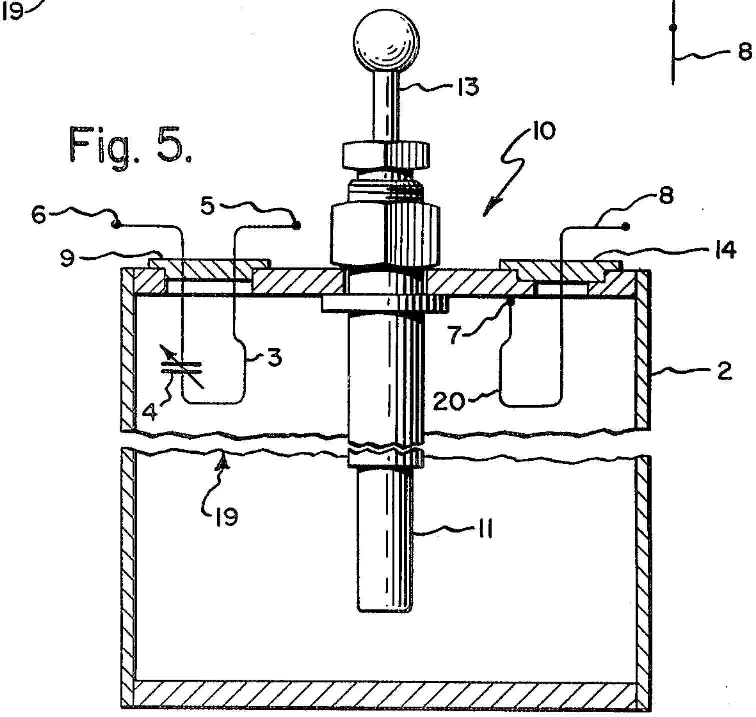
FIG. 5 is a semi-schematic illustration of a bandpass filter of the present invention.

FIGS. 3 and 5 show embodiments in which capacitor 4 is a variable capacitor and FIG. 4 shows an embodiment in which capacitor 4 is disposed exterior to the cavity. These embodiments represent a few of many possible variations to the basic filter design: all of which include the general characteristic of an inductive loop insulated from but inductively coupled into a resonant cavity.

FIG. 4 also shows an additional modification in which an inductive loop 20 is soldered or otherwise electrically connected to the interior of cavity 2 at junction point 7. This modification aids in converting the notch filter 1 into a bandpass filter 10 useful in the assembly of a multicoupler as will be described in further detail below.

Turning now to an examination of FIG. 5, the bandpass filter of the present invention is illustrated in a semi-schematic manner as including a resonant cavity 2; a moveable electrically conducting center probe 11, which may be adjustably positioned within the cavity by movement of probe stem 13; a series lumped constant reactive circuit 19, which includes an inductive loop 3 and a capacitance 4; and a coupling loop 20 connected to the interior of the cavity at junction 7. Reactive circuit 19 is mounted on a disk 9 which is rotatably fixed in a hole in the cavity wall so that the field within the cavity linked by loop 3 may be varied through rotation of circuit 19. Electrical connectors 5 and 6 are provided at opposite ends of the reactive circuit 19 and each of the leads which penetrate through disk 9 are electrically insulated therefrom so that the circuit is not grounded to cavity 2. Inductive loop 20 penetrates into the cavity in a similar manner through a rotatable disk 14. The internal field linked by loop 20 may also be somewhat varied by the field linked by loop 20 may also be somewhat varied by the rotation of disk 14.

The notch filter 1, when connected in series in a transmission line, responds differently at different frequencies to produce its notch filter characteristics. At the resonant frequency of the cavity, electro-magnetic energy is fed into the cavity by means of the inductive coupling between inductive loop 3 and the field of the cavity. The cavity resonates and overrides the characteristics of the lumped constant reactive circuit 19 to cause the reactive circuit to appear as a high impedance in series with the transmission line. At this frequency, therefore, notch filter 1 is analogous to an equivalent circuit in which a parallel resonant L-C circuit is connected in series with the line. It is this behavior and the resultant high impedance which creates the reject notch of the notch filter.

At other frequencies, the series lumped constant reactive circuit 19 of notch filter 1 merely acts as a distorted section of transmission line which permits the passage of energy therethrough. The notch filter of FIG. 1 contains an inductive reactance unbalanced by an equal capacitive reactance so that its characteristic curve appears somewhat like the asymmetric characteristic curve illustrated in FIG. 7. The shape of the curve demonstrates that frequencies on one side of the notch are passed with virtually no impedance up to a frequency quite close to the notch frequency so that the roll-off of the notch filter on this side of the notch is quite rapid. On the other side of the reject notch, the roll-off is asymmetrical and is low compared to the roll-off found on the first side of the notch.

Figure 2:
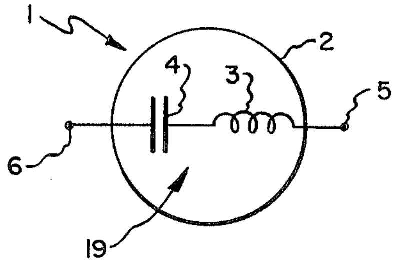
Figure 9:
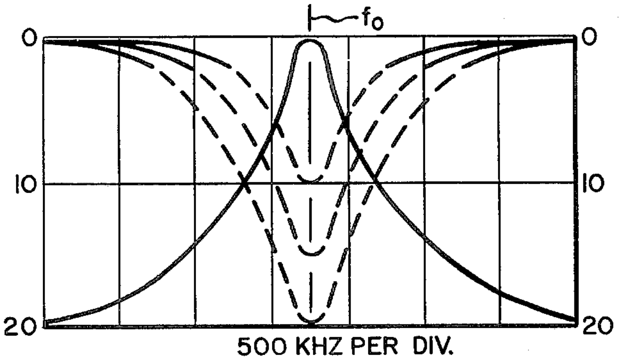
FIG. 9 is a graphical representation of three characteristic curves of a filter with three different degrees of coupling between the lumped series circuit and the resonant cavity.

The notch filter as shown in FIGS. 2 and 3 may include a lumped constant series reactive circuit 19 including a capacitor 4. If the capacitive reactance of capacitor 4 greatly exceeds the inductive reactance of inductor 3, then the opposite extreme shown in FIG. 8 results with the asymmetry of the characteristic curve appearing on the other side of the notch. When capacitor 4 is selected to have a capacitive reactance which is equal to the inductive reactance of inductor 3, then a symmetrical characteristic curve results; three examples of which are illustrated in FIG. 9. As can be seen, a properly balanced notch filter has a relatively sharp notch with excellent roll-off and broad pass bands on either side of the notch. As is illustrated by the three curves in FIG. 9, the roll-off of the notch filter decreases as the depth of the notch or the impedance of the filter is increased.

The three different situations illustrated by the three curves in FIG. 9 in which the same notch filter is adjusted to have three different notch depths, are obtained by causing the inductive coupling between loop 3 and the cavity 2 to be changed. As previously indicated, and as is evident from FIG. 5, rotation of mounting plate 9 in the hole in the cavity 2 causes a physical rotation of the inductive loop 3 so that a larger or smaller amount of the field within the cavity is linked by the loop. A particularly unique property of this notch filter is illustrated by FIG. 9 in that while rotation of loop 3 in the field of cavity 2 causes the depth of the notch of the filter to change, the frequency of the notch remains unchanged. Accordingly, in the series notch filter of the invention, the notch depth as well as the selectivity of the notch are independent of the notch frequency: contrasted to prior art notch filters which exhibit notch depth and notch frequency interdependency.

Turning now to an examination of FIGS. 4 and 5, the bandpass filter 10 of the present invention can be seen to differ from the notch filter 1 shown in FIGS. 1, 2 and 3 primarily by the additional presence of coupling loop 20 which is grounded to the interior of cavity 2 in a conventional manner. Actually, the same modifications of adding a grounded coupling loop could equally well be made to the devices shown in FIGS 1, 2 and 3. This has not been done however for the sake of brevity, but it should be understood that the principles to be described below would have equal application to such modifications.

Actual application of the bandpass filter 10 of the invention is also obtained by connection of the filter in series in a transmission line in a manner similar to the previously discussed notch filter 1. Bandpass filter 10 also simultaneously responds differently for signals having different frequencies. At the resonant frequency of the cavity, electro-magnetic energy is fed into the cavity by means of the inductive coupling between inductive loop 3 and the field of the cavity to produce cavity resonance. This energy is then inductively picked off by coupling loop 20 and exits the cavity along loop 20 in a bandpass filter mode. Thus loop 20 may be connected in a conventional manner to a channel containing a transmitting or receiving signal device tuned to the resonant frequency of the cavity in a multicoupler arrangement.

When operating as a bandpass filter as above described, the series connected reactive circuit 19 performs as the exciting inductive coupling. Circuit 19 is not actually physically grounded as is typical for a normal inductively coupled exciting loop in a bandpass filter. Measures are therefore taken to improve the efficiency of coupling of the bandpass filter 10 with the transmission line. A first possibility is to terminate the end of the transmission line in an impedance matched to the impedance of the line itself. In this case, a 3 db power split results with a portion of the energy being dissipated through the terminating impedance and with a portion of the energy being shunted through bandpass filter 10 to the signaling device connected to loop 20. In the event that the power split causes too great a reduction of signal strength at the position of the signaling device (for example, a receiver), a small preamplifier may be included in the channel to boost signal strength to acceptable levels.

A second measure which might be taken is the termination of the transmission line in a manner which causes an R.F. short circuit condition to be reflected up the line to the position of the reactive circuit 19 of the filter 10. In this circumstance, inductively coupled circuit 19 functions as if it were actually physically grounded and behaves as a bona fide conventional coupling loop with substantially all of the available energy at the resonant frequency of the cavity 2 being fed into the cavity and virtually none of the energy propagating down the line.

In either of the above two alternatives, electrical signals having frequencies other than the resonant frequency of the cavity continue to propagate down the line uneffected by the cavity since the cavity does not resonate. At these "other" frequencies, the series connected reactive circuit merely looks like a distorted section of transmission line.

Figure 7:
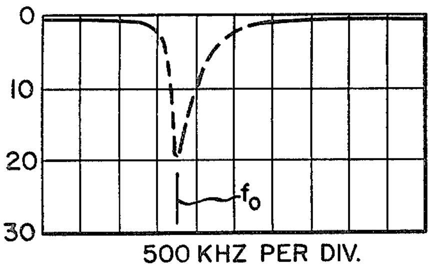
FIGS. 7 and 8 are graphical illustrations of asymmetric characteristic curves obtained by adjusting the capacitive reactance and the inductive reactance of the elements of the filter of the present invention.
Figure 8:
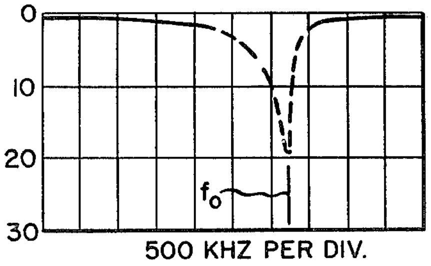

Since the bandpass filter 10 contains a series connected reactive circuit 19 similar to the above described notch filter 1, much of the information contained in FIGS. 7, 8 and 9 also applies to a discussion of the performance of bandpass filter 10. That is to say, the pass band portions (the solid line portions) of the upper curves in FIGS. 7, 8 and 9 above and below the "notch" are of the importance in the bandpass filter application looking across terminals 5 and 6 which the notch itself (the interrupted line portions) never comes into play since, at its resonant frequency, filter 10 does not function as a notch filter. At the resonant frequency of the cavity, either 3 db power split occurs or the R.F. short circuit condition prevents through energy propagation. Thus, it can be seen that the single bandpass filter 10 of the invention, in conjunction with a resonant transmission line system, substitutes in function for a conventional prior art circuit which usually includes both a notch filter and a bandpass filter, thereby eliminating the physical requirement of two resonant filters.

FIGS. 7, 8 and 9 show the frequency response of notch filter 10 across terminals 5 and 6 with coupling loop 20 unterminated in any load impedance. In this context, the response of filter 10 across terminals 5 and 6 at $f_o$, the resonant frequency of the cavity or channel frequency, is not of interest. The response which is of interest is above and below $f_o$. At these non-resonant frequencies, energy will pass in either direction relatively unimpeded, as shown by the solid portions of the response curves in the figures.

At the resonant frequency $f_o$ of the cavity, the response of interest between terminal 5 and spur 8 is shown as a typical bandpass selectivity curve in the lower portion of FIG. 9. In accordance with this curve, the filter 10 provides the attenuation desired between terminal 5 and spur 8 at all frequencies different from the resonant frequency $f_o$ of the filter 10.

The depth of the notch curves of FIGS. 7, 8 and 9 is related to the cross sectional coupling area of inductor 3 which intercepts the magnetic field on the interior of the cavity of filter 10. Proper operation of bandpass filter 10 includes matching the effective field intercepting cross sectional area of the inductor 3 with the field intercepting cross sectional area of coupling loop 20. The effective field intercepting area of both inductor 3 and coupling loop 20 may be concurrently and similarly varied to increase or decrease the bandpass selectivity as desired at the expense of increased or decreased insertion loss at the resonant frequency of the filter.

The symmetry of the response between terminals 5 and 6 are controlled by the same factors as those previously discussed with regard to the notch filter 1. In those embodiments in which filter 10 includes both inductor 3 and capacitor 4, if the capacitive reactance of capacitor 4 is smaller than the inductive reactance of inductor 3, the characteristic curve of the bandpass filter across terminals 5 and 6 appears somewhat like the asymmetric characteristic curve illustrated in FIG. 7. Frequencies on one side of the notch are passed with virtually no impedance up to a frequency quite close to the "notch" so that the roll-off of a filter on this side of the notch is quite rapid. On the other side of the "notch", the roll-off is asymmetrical and is less abrupt compared to the roll-off found on the first side of the notch.

On the other hand, if the capacitive reactance of capacitor 4 is greater than the inductive reactance of inductor 3, then the opposite extreme shown in FIG. 8 results with the asymmetry of the characteristic curve appearing on the other side of the "notch". When capacitor 4 is selected to have a capacitive reactance which is equal to the inductive reactance of inductor 3, then a symmetrical characteristic curve results: three of which are illustrated in FIG. 9. As can be seen, when properly balanced, the filter has a relatively sharp notch with excellent roll-off and broad lateral pass bands on either side of the notch which is the area of primary interest when the bandpass filter 10 is used in a multicoupler application. As is illustrated by the three curves in FIG. 9, the roll-off of the filter decreases as the coupling of reactive circuit 19 with the field in the cavity is increased.

The three partially dashed curves in FIG. 9 illustrating three different modes of the same filter are obtained as described above for notch filter 1 by causing the inductive coupling between loop 3 and cavity 2 to be changed. Rotation of mounting plate 9 causes rotation of loop 3 so that a larger or smaller amount of field within the cavity is linked. The same type of effect can be obtained through rotation of plate 14 to change the inductive coupling of loop 20. Changes in coupling causes changes in insertion loss and in selectivity: the higher the loss the greater the selectivity.

Looking at FIGS. 6 and 10, construction and operation of a number of multicouplers 18 will be described. Each of the multicouplers 18 of the figures includes an antenna 16 at one end of the through transmission line 17 and a plurality of signaling devices 15 coupled thereto along its length. Signaling devices 15 could consist of either transmitters or receivers or both. As will be understood, such multiple coupling of a plurality of signaling devices to a common transmission line and antenna creates conventional intermodulation, noise interference, and insertion loss difficulties which should be minimized.

Each of the signaling devices 15 lies at the end of a branch transmission line 8 which may desirably include one or more conventional bandpass filters 12. With this arrangement, each signaling device 15 and its associated branch transmission line 8 may generally be referred to as a channel. A plurality of channels may be connected as desired to one transmission line 17 and are designated channels A through N. Each of the channels, at one end of branch line 8, is coupled to the through transmission line 17 by means of one of the bandpass filters of the present invention. It can be seen therefore that through transmission line 17 is periodically interrupted with the series insertion therein of one of the bandpass filters 10. Sucn interruption and insertion forms junctions or T connections of the channel with the through line.

Multicouplers 18 are readily expandable by the simple expedient of breaking the connection between transmission line 17 and either side of bandpass filter 10 and inserting in series therewith an additional section of transmission line 17 and an additional bandpass filter 10 to accommodate the new channel. When the frequency range of the multicoupler is narrow and the reactive circuits 19 of the bandpass filter 10 have been properly adjusted, the expedient of inserting a new channel anywhere in the transmission line may be accomplished without regard to the frequency order of the channels. Where close channel separation is desirable, the capacitive reactance and the inductive reactance of each of the filters 10 may be adjusted to be unequal to cause their characteristic curves to be asymmetrical as illustrated in either FIG. 7 or 8. With such skewed or asymmetrical curves, closer separation of adjacent channels can be achieved if a frequency order of the channels is observed.

Figure 6:
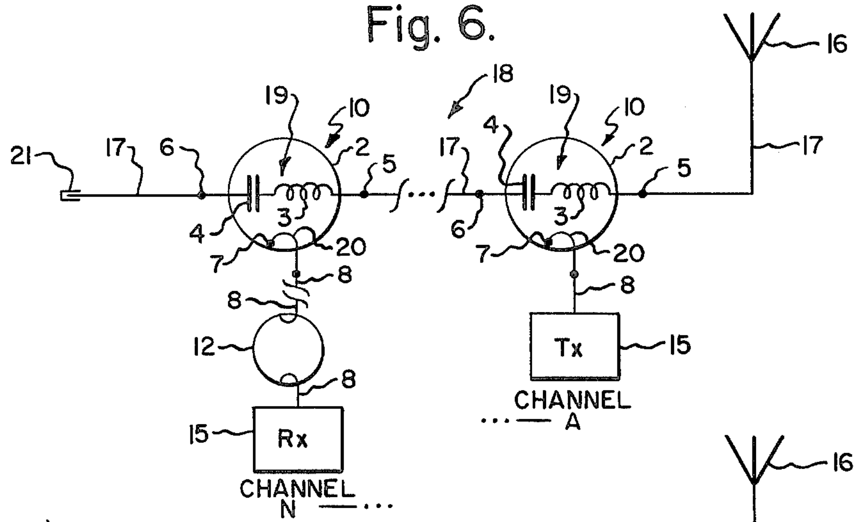
FIG. 6 is a schematic diagram of a first embodiment of a multicoupler constructed in accordance with the present invention.
Figure 10:
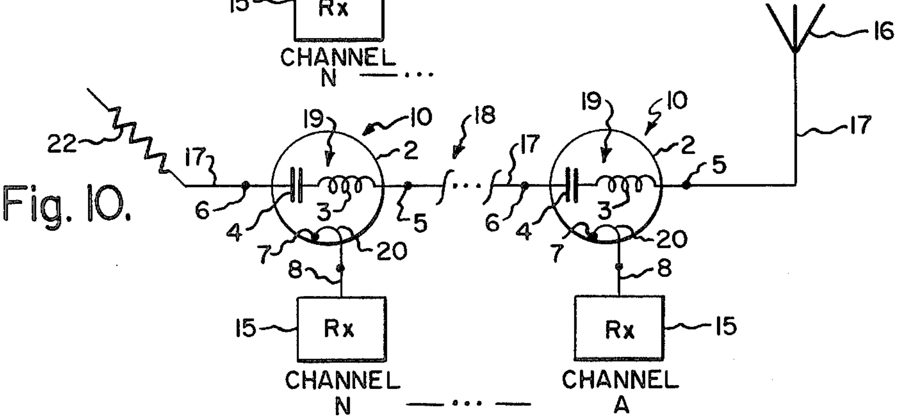
FIGS. 10 and 12 are illustrations of additional multicoupler embodiments assembled in accordance with the invention.

Attention is now directed to the terminal end of the transmission lines in FIGS. 6 and 10 where two different types of termination are illustrated. The termination of FIG. 6 is illustrated as being a simple stub 21. In actual practice, stub 21 may be of either the open circuit or short circuit type. The function of this type of stub termination is to create a reflected "floating" R.F. short circuit condition at the positions along line 17 of each of the reactive circuits 19 of each of the bandpass filters 10. Accordingly, in these embodiments, the electrical lengths of the transmission line intermediate the terminating stub 21 and each of the bandpass filters 10 must be "tuned" and have specific lengths. In the case of an open circuit termination, each of the filters 10 is located in the transmission line at an effective electrical distance from stub 21 substantially equal to an odd multiple of a quarter wavelength of the associated channel frequency within the band of frequencies for which the multicoupler 18 is designed. In the case of a short circuit termination of line 17, each of the filters 10 is located in the transmission line at an effective electrical distance from stub 21 substantially equal to a multiple of a half wavelength of the frequency of the associated channel. In the case of a short circuit termination, the terminal short may be created in any of a number of ways in addition to a stub 21 such as, for example, by terminating in a grounded coupling loop into the interior of a conventional bandpass filter of the last channel connected to the line. In any event, when a multicoupler 18 is expanded to include additional channels, these effective electrical length requirements are easily observed by the addition of not only a channel and its associated T junction bandpass filter 10 but also by a "tuned" section of transmission line 17 in series with the filter 10.

FIG. 10 illustrates a second type of transmission line 17 termination which includes a terminator 22 whose symbol resembles the symbol of a resistor. In this case, line 17 is terminated in an impedance which matches the characteristic impedance of the transmission line 17 itself. As is well known, line 17 then appears as an infinite line so that a power split is permitted to occur at each of the bandpass filters 10 with a portion of the energy at the resonant frequency of the particular filter 10 being diverted to its associated channel and with a portion of the energy being dissipated through terminal impedance 22. The embodiment of FIG. 10, while laboring under the power split losses occasioned by this manner of termination, has the advantage that the "tuned line" requirement of the previously described embodiments of FIG. 6 is relaxed. Thus the multicoupler may be expanded or otherwise changed without regard to the cable lengths intermediate the channel and the end of line 17.

Figure 11:
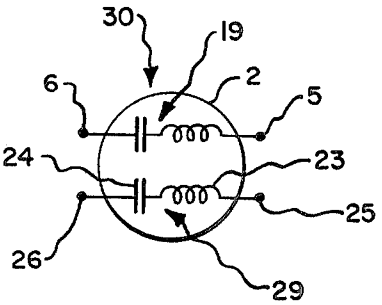
Figure 12:
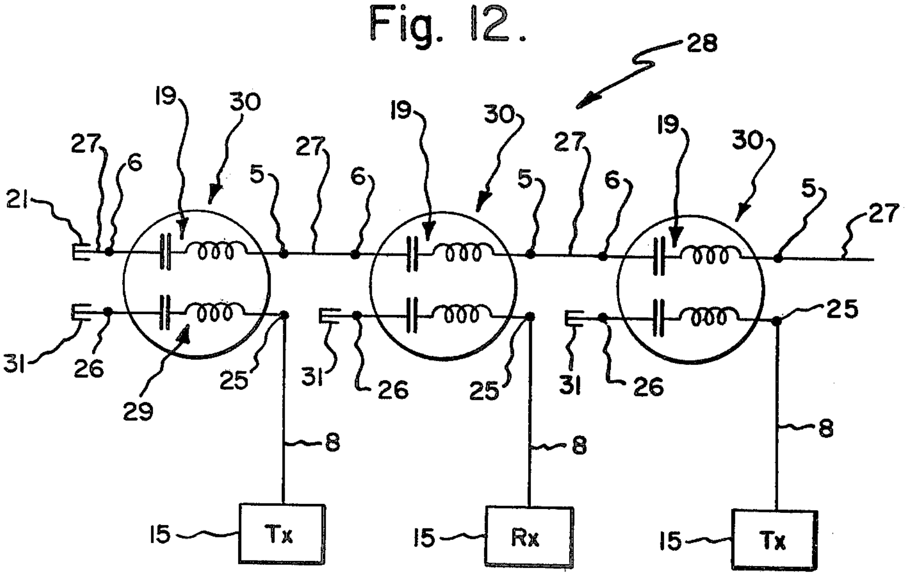

Turning now to FIGS. 11 and 12, additional embodiments of both the bandpass filter and a multicoupler utilizing same are illustrated. The bandpass filter 30 of FIG. 11 differs from filter 10 of FIGS. 4 and 5 in that the function of coupling loop 20 is performed by a second lumped constant reactive circuit 29 which in many respects is similar to reactive circuit 19. Thus circuit 29 consists of an inductor 23 inductively coupled with the interior of cavity 2 but otherwise electrically insulated therefrom. Capacitor 24 also may constitute a portion of reactive circuit 29 and connectors 25 and 26 are provided for series connection of circuit 29 with other components. With a structure similar to that shown in FIG. 5, circuit 29 may be mounted in a manner to permit its rotation in order to vary its inductive coupling with the field within cavity 2.

As can be seen from FIG. 12, multicoupler 28 somewhat resembles the multicoupler shown in FIGS. 6 and 10. That is, each channel is coupled to through transmission line 27 by series insertion of its respective filter 30 therein. Any of the above described termination techniques may be used to terminate one end of line 27. Signaling devices 15 are then electrically connected to filter 30 by spur transmission line 8 at coupler 25. In order to make reactive circuit 29 perform like grounded coupling loop 20 of filter 10, an open or closed circuit stub 31 is connected to junction 26. Stub 31 functions in a manner similar to that previously described with respect to stub terminator 21. Thus, when properly spaced from filter 30, stub 31 causes an effective electrical short circuit condition to be reflected to or created at one side of reactive circuit 29, thereby creating the necessary conditions for circuit 29 to efficiently "pick-off" the signal from the interior of the filter. While not shown, an alternative is to connect a matched impedance to junction 26 in a manner similar to that described above with respect to element 22 of the multicoupler 18 shown in FIG. 10.

What is claimed is:

1. An electrical bandpass filter for series connection in a through transmission line which carries electrical signals within a given frequency band, said filter adapted to pass only signals of a predetermined frequency into and out of a branch transmission line, to block signals of said predetermined frequency from propagating down said through transmission line in one direction but not the other, and to pass all other signals substantially undisturbed, characterized by including:

(a) a cavity resonator tuned to be resonant at said predetermined frequency;

(b) a series lumped constant reactive circuit including a series connected inductive loop at least a portion of which is disposed within said cavity resonator so as to inductively couple with the field within said resonator, said reactive circuit being otherwise electrically insulated from said cavity resonator and having first and second ends for series connection in a transmission line; and (c) means for inductively coupling with the interior of said cavity resonator and adapted for connection to said branch transmission line.

2. The filter as recited in claim 1 characterized by further including means electrically associated with said series lumped constant reactive circuit for creating an effective short condition between said circuit and ground for said predetermined frequency.

3. The filter as recited in claim 2 characterized in that said means for creating an effective short condition comprises a transmission line terminating in an open circuit and having a length substantially equal to an odd multiple of a quarter wavelength of said predetermined frequency.

4. The filter as recited in claim 2 characterized in that said means for creating an effective short condition comprises a transmission line terminating in a short circuit and having an electrical length substantially equal to a multiple of a half wavelength of said predetermined frequency.

5. The filter as recited in claim 1 characterized in that said series lumped constant reactive circuit includes a capacitance connected in series with said inductive loop.

6. The filter as recited in claim 5 characterized in that both said inductive loop and said capacitance are disposed within said cavity resonator whereby said inductive loop links the field within said cavity.

7. The filter as recited in claim 5 characterized in that said capacitance includes a variable capacitor.

8. The filter as recited in claim 5 characterized in that the capacitance and the inductive loop of said series lumped constant reactive circuit are adjusted such that the capacitive reactance of said capacitance and the inductive reactance of said inductive loop are substantially equal.

9. The filter as recited in claim 1 characterized by including means for changing the inductive coupling between said inductive loop and said cavity resonator.

10. The filter as recited in claim 9 characterized in that said inductive loop of said lumped constant reactive circuit is mounted within said cavity and includes means for permitting the variation of position of said inductor within said cavity.

11. The filter as recited in claim 10 characterized in that said means for permitting the variation of position of said inductor within said cavity includes means for rotatably mounting said inductive loop within said cavity.

12. The filter as recited in claim 1 characterized by including means for changing the inductive coupling between said cavity resonator and said means for inductively coupling with said cavity resonator.

13. An electrical filter adapted to join a branch transmission line to a through transmission line carrying a plurality of electrical signals having frequencies within a designated band, said filter functioning to pass only a narrow band of frequencies within said designated band into said branch line while preventing only said narrow band of frequencies from propagating down said through line, characterized by including:

(a) a series lumped constant reactive circuit comprising a series connected variable capacitance and an inductive loop, said circuit having first and second ends for series connection in said through line;

(b) a cavity resonator inductively coupled with but otherwise electrically insulated from said reactive circuit, said cavity resonator being tuned to resonate at the frequencies of said narrow band of frequencies and said cavity resonator physically containing said reactive circuit therein;

(c) means electrically associated with said reactive circuit for creating an effective short condition between said circuit and ground for said narrow band of frequencies; and (d) a coupling loop electrically connected to ground within said cavity at its first end and adapted for connection to said branch line at its other end.

14. A multicoupler circuit for coupling a plurality of signaling devices operating at different frequencies within a given band of frequencies to a common transmission line to permit propagation of energy of all frequencies along said line in one direction but to block energy having a frequency equal to that of a particular signaling device from propagating along said line in a reverse direction at the position at which said particular signaling device is coupled to the transmission line and to permit signals at the frequency of the signaling device access to or exit from said particular signaling device, characterized in that:

(a) said line passes consecutively through a plurality of resonant cavities;

(b) said line includes a plurality of lumped constant series reactive circuits connected in said line in series with one another, each of said series circuits including at least a series connected inductive loop inductively coupled with one of said resonant cavities, each of said plurality of signaling devices being inductively coupled with the internal field of one of said plurality of resonant cavities, and each of said cavities being tuned to resonate at the frequency of its respective signaling device; and (c) said line including means for producing an effective short circuit condition at the location of each of said series connected inductive loops.

15. The circuit as recited in claim 14 characterized in that each of said signaling devices is coupled with a respective one of said resonant cavities by means of a branch transmission line and a coupling loop electrically connected to an interior surface of its respective cavity.

16. The circuit as recited in claim 14 characterized in that each of said inductive loops is disposed interior to its respective cavity.

17. The circuit as recited in claim 14 characterized in that said lumped constant series reactive circuits each include a capacitance connected in series with its inductive loop.

18. The circuit as recited in claim 15 characterized in that said lumped constant series reactive circuits each include a capacitance connected in series with its inductive loop.

19. The circuit as recited in claim 18 characterized in that each of the capacitances is selected to have a capacitive reactance substantially equal to the inductive reactance of the inductive loop to which it is series connected.

20. The circuit as recited in claim 14 characterized in that said means for producing an effective short circuit condition includes a short circuit at one end of said transmission line and further in that each of said series connected inductive loops is spaced from said short circuited end of said transmission line by an effective electrical distance substantially equal to a multiple of a half wavelength of the frequency of its respective signaling device.

21. The circuit as recited in claim 14 characterized in that said means for producing an effective short circuit condition includes an open circuit at one end of said transmission line and further in that each of said series connected inductive loops is spaced from said open end of said transmission line by an electrical distance substantially equal to an odd multiple of a quarter wavelength of the frequency of its respective signaling device.

22. A circuit for coupling a plurality of channels to a common transmission line, each channel containing a signaling device operating at a frequency within a given band of frequencies, said circuit functioning to permit only energy at the frequency of the signaling device of a given channel to enter and leave said given channel, characterized in that:

(a) said line passes consecutively through a plurality of resonant cavities;

(b) said line includes a plurality of lumped constant series reactive circuits connected in said line in series with one another, each of said series circuits including at least a series connected inductive loop inductively coupled with one of said resonant cavities, each of said plurality of signaling devices being inductively coupled with the internal field of a different one of said plurality of resonant cavities, and each of said cavities being tuned to the frequency of its respective signaling device; and (c) said line including means for causing any energy split between said channel and said line, for energy entering said channel and between the two opposite portions of said line, for energy leaving said channel.

23. The circuit as recited in claim 22 characterized in that said means for causing an energy split includes a transmission line termination whose impedance matches the impedance of the line.

24. A multicoupler for joining a plurality of transmitter and/or receiver signaling devices tuned to different frequencies within a given band, to a common antenna characterized by including a bandpass filter for each respective signaling device, said filter comprising a cavity resonator, a series lumped constant reactive circuit inductively coupled with but electrically insulated from said cavity resonator, said circuit having opposite ends connected in series with said antenna and with the other series lumped constant reactive circuits of the other filters, and a coupling loop inductively coupled at one end into said cavity and electrically connected to the respective signaling device at the other.

25. The multicoupler as recited in claim 24 characterized in that said series lumped constant reactive circuit includes an inductive loop disposed within and inductively coupled with said cavity resonator.

26. The multicoupler as recited in claim 25 characterized in that each cavity resonator is tuned to resonate at the frequency of its respective signaling device.

27. The multicoupler as recited in claim 26 characterized in that said series lumped constant reactive circuit includes a capacitance connected in series with said inductive loop.

28. The multicoupler as recited in claim 27 characterized in that both said inductive loop and said capacitance are disposed within said cavity resonator whereby said inductive loop links the field within said cavity.

29. The multicoupler as recited in claim 27 characterized in that said capacitance includes a variable capacitor.

30. The multicoupler as recited in claim 27 characterized in that the capacitor and the inductive loop of said series lumped constant reactive circuit are such that the capacitive reactance of said capacitance and the inductive reactance of said inductor are equal.

31. The multicoupler as recited in claim 27 characterized in that each of said bandpass filters includes means for changing the inductive coupling between said inductive loop and said cavity resonator.

32. The multicoupler as recited in claim 31, characterized in that said inductive loop of said series lumped constant reactive circuit is mounted within said cavity and includes means for permitting the variation of position of said inductor within said cavity.

33. The multicoupler as recited in claim 32 characterized in that said means for permitting the variation of position of said inductor within said cavity includes means for rotatably mounting said inductive loop within said cavity.

34. The multicoupler as recited in claim 24 characterized by further including means electrically associated with the reactive circuit of each of said bandpass filters for creating an effective short circuit condition between said circuit and ground only at the tuned frequency of the respective signaling device.

35. The multicoupler as recited in claim 34 characterized in that said means for creating an effective short circuit includes a short circuit electrically connected to but spaced from each of said reactive circuits of each of said bandpass filters by an electrical distance substantially equal to a multiple of a half wavelength of a wave form whose frequency is substantially equal to the frequency of its respective signaling device.

36. The multicoupler as recited in claim 34 characterized in that said means for creating a short circuit includes an open circuit electrically connected to but spaced from said reactive circuit of each of said bandpass filters by an electrical distance substantially equal to an odd multiple of quarter wavelength of a wave form whose frequency is substantially equal to the frequency of its respective signaling device.

37. The multicoupler as recited in claim 24 characterized in that each of said reactive circuits are series connected in a common transmission line terminating at one end at said antenna and at the other in an impedance substantially equal to the impedance of said transmission line, whereby an energy split is created between said signaling device and said transmission line for energy propagating in said line away from said antenna and whereby an energy split is created between the two opposite portions of said transmission line for energy at the frequency of said signaling device that is propagating away from said signaling device.

38. The filter as recited in claim 1 characterized by including means electrically associated with said means for inductively coupling with the interior of said cavity for creating an effective short circuit condition between ground and said inductively coupling means for said predetermined frequency.

39. A circuit for coupling a plurality of channels to a common through transmission line, each channel operating at a frequency within a given band of frequencies, said circuit functioning to permit only energy at the frequency of the given channel to enter and leave said given channel, characterized in that:

said line passes consecutively through a plurality of resonant cavities and includes a plurality of spaced lumped constant reactive series circuits, each of said series circuits including at least a series connected inductive loop inductively coupled with one of said resonant cavities, each of said plurality of channels being inductively coupled with the internal field of a different one of said plurality of resonant cavities, and each of said cavities being tuned to the frequency of its respective channel.

40. The circuit as recited in claim 39 characterized by further including means electrically associated with said through transmission line for creating an effective short circuit condition between ground and each of said plurality of reactive series circuits for the frequency of its respective channel.

41. The circuit as recited in claim 39 characterized in that each channel is electrically connected to an inductor which is inductively coupled with but electrically insulated from a different one of said plurality of resonant cavities, each inductor being electrically associated with a means for creating an effective short circuit condition between one end of said inductor and ground.

* * * * *

UNITED STATES PATENT AND TRADEMARK OFFICE
CERTIFICATE OF CORRECTION

PATENT NO. : 4,249,147

DATED : Feb. 3, 1981

INVENTOR(S) : Daniel P. Kaegebein

It is certified that error appears in the above-identified patent and that said Letters Patent are hereby corrected as shown below:

Col. 3, line 15 - After "friction", please insert --- couplings ---.

Col. 6, lines 6 and 7 - Please delete the second occurrence of "field linked by loop 20 may also be somewhat varied by".

Col. 12, line 19 - Before "lumped", please insert --- series ---.

Col. 14, line 7 - Please change "any" to --- an ---.

Signed and Sealed this

*Second* Day of *June 1981*

[SEAL]

*Attest:*

RENE D. TEGTMEYER

*Attesting Officer* *Acting Commissioner of Patents and Trademarks*